US006724795B2

(12) United States Patent
Reid (10) Patent No.: US 6,724,795 B2
(45) Date of Patent: Apr. 20, 2004

(54) SEMICONDUCTOR LASER (75) Inventor: Benoit Reid, Gloucester (CA)

(73) Assignee: Bookham Technology, PLC, Abingdon (GB)

( * ) Notice: Subject to any disclaimer, the term of this patent is extended or adjusted under 35 U.S.C. 154(b) by 0 days.

(21) Appl. No.: 10/141,914

(22) Filed: May 10, 2002

(65) Prior Publication Data

US 2003/0210720 A1 Nov. 13, 2003

(51) Int. Cl.$^7$ ................................................. H01S 5/00
(52) U.S. Cl. ........................... 372/45; 372/46; 372/43; 372/39
(58) Field of Search ............................ 372/46, 45, 43, 372/39

(56) References Cited

U.S. PATENT DOCUMENTS

| 5,665,637 | A | * | 9/1997 | Chand | 372/46 |
|---|---|---|---|---|---|
| 5,818,860 | A | | 10/1998 | Garbuzov et al. | |
| 5,933,562 | A | | 8/1999 | Dütting et al. | |
| 6,022,760 | A | * | 2/2000 | Lebby et al. | 438/123 |
| 6,327,288 | B1 | * | 12/2001 | Wang et al. | 372/46 |
| 6,362,069 | B1 | * | 3/2002 | Forrest et al. | 438/401 |
| 6,382,800 | B2 | * | 5/2002 | Sato | 357/103 |

FOREIGN PATENT DOCUMENTS

| GB | 2031644 | 9/1978 | ............. H01S/3/19 |
|---|---|---|---|
| WO | 9116747 | 4/1991 | ............. H01S/3/19 |
| WO | 9608062 | 8/1995 | ............. H01S/3/19 |

OTHER PUBLICATIONS

Garbuzov, D.; Broadened Waveguide Design for Separate Confinement Quantum Well; Lasers and Electro–Optics Society Annual Meeting, 1996. LEOS 96., IEEE, vol. 1; 1996, pp. 344–345, vol. 1.

Xu, L.; Garbuzov, D.; Forrest, S.; Menna, R.; Martinelli, R.; Connolly, J.; Very Low Internal Loss, 1.5 μm Wavelength SCH–MQW InGaAsP/InP Laser Diodes With Broadened–Waveguides; Lasers and Electro–Optics Society Annual Meeting, 1996., LEOS 96., IEEE, vol. 1, 1996, pp 352–353, vol. 1.

Garbuzov, D.Z.; Menna, R.J.; Martinelli, R.U.; Aholes, I.H.; Connolly, J.C.; High Power Continuous and Quasi–Continuous Wave InGaAsP/InP Broad–Waveguide Separate Confinement–Heterostructure Multiquantum Well Diode Lasers; Electronics Letters, vol. 33, Issue 19, Sept 1997, pp 1635–1636.

Delepine, S.; Gérard, F.; Fillion, T.; Pasquier, J.; Gaborit, F.; Chardon, J.P.; Boubal F.; Salet, P.; 0.7W In Single Mode Fibre From 1.48 μm Semiconductor Unstable–Cavity Laser With Low–Confinement Asymmetric Epilayer Structure; Electronics Letters, 3$^{rd}$ Feb. 2000, vol. 36, No. 3, pp. 221–223.

Johnson, John E.; Ketelsen, Leonard J.–P.; Ackerman, David A.; Zhang, Liming; Hybertsen, Mark S.; Glogovsky, Kenneth G.; Lentz, Charles W.; Asous, Waleed A.; Reynolds, C. Lewis; Geary, J. Michael; Kamath, Kishore K.; Ebert, Chris W.; Park, Miri; Przybylek, George J.; Leibenguth, Ronald E.; Broutin, Scott L.; Stayt Jr., John W.; Dreyer, Kevin F.; Peticolas, Larry J.; Hartman, Robert L.; Koch, Thomas L.; Fully Stabilized Electroabsorption–Modulated Tunable DBR Laser Transmitter For Ling–Haul Optical Communications; IEEE Journal on Selected Topics in Quantum Electronics, vol. 7, No. 2, Mar./Apr. 2001, pp. 168–177.

* cited by examiner

Primary Examiner—Paul Ip
Assistant Examiner—Leith A Al-Nazer
(74) Attorney, Agent, or Firm—Lahive & Cockfield, LLP; Anthony A. Laurentano (57) ABSTRACT A semiconductor laser adapted for telecommunications applications. The opitical mode delivered by the laser has a high power output beam and a narrow far field, thus, enabling efficient coupling of the laser into small numerical aperture optical fibers. The laser is made up of a semiconductor heterostructure and one or more optical trap layers.

35 Claims, 6 Drawing Sheets

SEMICONDUCTOR LASER

FIELD OF THE INVENTION

This invention relates to semiconductor lasers, and more particularly to high power semiconductor lasers suitable for optical telecommunication applications.

BACKGROUND OF THE INVENTION

Semiconductor lasers are typically formed from pn-junctions that have been enhanced to facilitate the efficient recombination of electron-hole pairs leading to the emission of radiation (light energy). A well known improvement to semiconductor lasers was the addition of a new layer of material between the P-type and N-type semiconductor layers, the new layer of material having a lower band gap energy than P-type and N-type layers. The layer formed by the material having the lower band gap energy is commonly referred to as the active region (or active layer) in a semiconductor laser.

Typically, a heterojunction refers to an interface between two different materials. Therefore, the insertion of an extra layer (active region) between the P-type and N-type layers results in what is known as a double heterostructure, as there will be a heterojunction at the interface of both the P-type and N-type materials. The doping in the active region is set at various levels depending upon the effect it is intended to have.

Thus, it is now common practice for semiconductor heterostructure lasers to be made up of three or more semiconductor layers. The simplest lasers include a P-type confinement region (P-type layer), an N-type confinement region (N-type layer) and an active region. The active region is typically made up of a number of layers and is located in the depletion region of the pn-junction between the P-type and N-type confinement regions. The optical mode is primarily confined in the active region because of the difference in the index of refraction between the active region, and the P-type and N-type confinement regions. The active region provides gain to the optical mode when the heterostructure is forward biased.

It is within the active region where light is generated once the semiconductor laser is forward biased and current is injected into the heterostructure. The active region is often composed of many layers in order to tailor the performance of the laser to meet the desired requirements (e.g. modulation bandwidth, power, sensitivity to temperature, etc.) of the laser's intended application.

The maximum optical output power of a semiconductor laser is usually limited by heating. The temperature of the active region increases with drive current, which degrades the laser performance. To achieve high optical power, one usually needs to increase the cavity length and the ridge width, which decreases the dissipated power density and keeps the laser from over heating. The power density is decreased because the electrical and thermal impedances decrease as the area where the current is injected increases.

When the cavity length is increased (typical cavity length is 2 mm for a hitch power laser), the efficiency (mW of optical power/mA of drive current) decreases because of internal optical loss in the cavity (that is not particular to the ridge structure, but is common in all structures). The optical loss is mainly clue to the absorption of the light energy in the P-type material (region). Decreasing the overlap of the optical mode within the P-type region would then be a useful way to decrease the loss of light energy within the laser, which would enable the use of longer cavities to be used to create lasers with higher output power.

There are different structures that can be used to decrease the optical losses (i.e. losses of light energy). However, those structures usually decrease the optical mode size in the laser cavity. The drawback is that the far field of the optical mode (i.e. optical far field) gets wider and the optical power is more difficult to couple into an optical fiber. The optical fat field and the optical mode in the laser cavity (the near field) are mathematically related by Fourier transform. This is a consequence of optical diffraction. Usually the optical far field is symmetric even though the near field is not. The loss in the coupling efficiency into the fiber happens only because the optical mode in the fiber and the laser far field do not have the same shape. An optical fiber can only accept a circular spot with a maximal divergence. The laser tar field is usually elliptical and can have a large divergence.

For telecommunication applications it is the amount of optical power coupled into the fiber and not the raw optical power out of the laser that is significant. Thus, there is a need for a structure that simultaneously: 1) has low optical losses, so that a long cavity can be used to achieve high output power; 2) maintains a low divergence so that there is more power of the elliptical far field coupled into the optical fiber.

The active region is commonly made up of a number of layers, some of which are designed to be quantum wells (or bulk wells). A quantum well is designed to be a very thin layer, thus allowing a better localization of electrons in the conduction band and holes in the valence band that will enhance electron-hole pair recombination. When an electron-hole pair recombine the excess energy the electron had possessed is emitted as light (radiation) adding to the operation of the laser. Furthermore, reducing the band gap energy of the active region relative to the band gap energies of the two confinement layers improves the confinement of the electrons and holes to the active region; thus, the optical mode profile is guided to remain within a narrow spot. However, for lasers suitable for optical telecommunications, an optical mode profile that is too narrowly confined is difficult to couple into a fiber as it will have a wide far field.

To achieve the best performance in a high-power laser, both the internal and external efficiency of the laser must be maximized. The internal efficiency of a laser is the efficiency at which electrical energy is converted into light energy (i.e. into the optical mode). The external efficiency is the efficiency at which the optical mode leaves the laser. However, there is a trade-off between the two measures of efficiency and thus far high power lasers have been limited by this trade off. Specifically, when considering semiconductor lasers, the external efficiency is largely the result of optical mode energy losses in P-type confinement layer, which tends to absorb much more optical energy than the active or N-type layers. On the other hand, internal efficiency (of semiconductor lasers) is usually dominated by current leakage which increases with temperature, and the temperature in turn increases with drive current. In other words, the electrical energy supplied to the laser is not maximally converted into optical energy within the laser as some current is dissipated through the semiconductor layers.

There is also another significant source of optical energy loss that must be taken into account when considering lasers for optical telecommunication applications. Semiconductor lasers used for optical telecommunication applications must hare their outputs coupled to a fiber and as such it is common that lasers are commercially packaged with a short piece of fiber, known as a pigtail, already aligned to the output of the laser. Thus, for telecommunication applications the external efficiency of a laser should be measured to include the effects of industrial packaging. In this case that would mean that the external efficiency of a laser should be measured at the end of the pigtail so that coupling losses can be taken in account. In other words, the potential for coupling loss from the laser into the pigtail must be considered in the design of a laser to be used for optical telecommunication applications as coupling loss can be a significant contributor to the degradation of the external efficiency. Precise alignment of the laser output to the pigtail is not enough to solve this problem. Current high-power lasers have outputs that have a wide far field, due to attempts to confine the optical mode in the active region. This fact combined with the current use of small numerical aperture fibers required for reduced distortion optical transmissions create a situation where there is a significant optical mode energy loss to be accounted for when coupling the laser output into the fiber.

It would be desirable to have a high power semiconductor laser that was optimized to be internally efficient, experienced low optical energy losses within the laser and had an output beam with a narrow far field so that the beam could be coupled into a fiber with minimal optical coupling loss.

SUMMARY OF THE INVENTION

According to a first broad aspect of the invention provided is a semiconductor laser having a plurality of layers. The plurality of layers in sequence include a first metal contact layer; an N-type semiconductor substrate; an N-type semiconductor optical trap layer; an N-type semiconductor confinement layer; an active region, the active region comprising semiconductor materials; a P-type semiconductor confinement layer, wherein the P-type semiconductor confinement layer, the active region and N-type semiconductor confinement layer collectively comprise a heterostructure having a pn-junction (depletion region) substantially close to and within the active region; a P-type contact layer; at least one dielectric layer, each of the at least one dielectric layer having a via etched through it providing electrical contact access to the P-type (contact layer; a second metal contact layer contacting the P-type contact layer.

In some embodiments, the plurality of layers are cleaved in at least two places along a crystallographic plane, that is perpendicular to plane of the layers, forming a resonating cavity having mirror facets on both ends.

In some embodiments, the semiconductor laser produces internally a laterally confined asymmetrical optical mode having a peak optical intensity substantially in the active region, the asymmetrical optical mode having an optical intensity distribution through the plurality of layers that has substantially more optical mode energy distributed within the N-type semiconductor confinement layer, the N-type semiconductor optical trap layer and the N-type semiconductor substrate layer as compared to an amount of optical mode energy present in the P-type semiconductor confinement layer.

In some embodiments the active region of the semiconductor laser has a plurality of quantum wells, each quantum well sandwiched between two barrier layers.

In some embodiments the semiconductor laser also has an etch-stop layer embedded within the P-type semiconductor confinement layer. In such embodiments the semiconductor further comprises a ridge structure, wherein the P-type semiconductor confinement layer is partially within the ridge structure, the ridge structure laterally confining the laterally confined asymmetrical optical mode.

In some embodiments the semiconductor laser also has a ridge structure, wherein the P-type semiconductor confinement layer is substantially within the ridge structure.

In some embodiments the semiconductor laser also has a ridge structure containing a substantial portion of the P-type semiconductor confinement layer.

In some embodiments of the semiconductor laser the N-type semiconductor substrate layer is N-type InP (Indium Phosphide)

In some embodiments of the semiconductor laser the N-type semiconductor optical trap layer is an N-type InGaAsP (indium Gallium Arsenicle Phosphide) alloy.

In some embodiments of the semiconductor laser the N-type semiconductor confinement layer is N-type InP.

In some embodiments of the semiconductor laser the active region is substantially made up of an InGaAsP alloy.

In some embodiments of the semiconductor laser the P-type semiconductor confinement layer is P-type InP.

In some embodiments the semiconductor laser also has, below the N-type semiconductor optical trap layer, at least one additional N-type semiconductor confinement layer and at least one additional N-type semiconductor optical trap layer.

In some embodiments of the semiconductor laser the N-type semiconductor optical trap layer has a plurality of sub-layers.

In some embodiments of the semiconductor laser the two mirror facets arE coated with a respective first and second dielectric material. In such embodiments the first dielectric material may be highly reflective, while the second dielectric material is less reflective than the first dielectric material.

According to a second broad aspect of the invention provided is a laser internally generating an asymmetrical optical mode, the asymmetrical optical mode having a single maximum optical intensity peak and optical intensity distribution that has substantially more of the optical mode energy distributed to a first side of the single maximum optical intensity peak as compared to the amount of the optical mode energy on the second side of the single maximum optical intensity peak.

According to a third broad aspect of the invention provided is a semiconductor heterostructure having a plurality of layers. The plurality of layers in sequence include a first metal contact layer; an N-type semiconductor substrate; a first N-type semiconductor optical trap layer; a first N-type semiconductor confinement layer; a second N-type semiconductor optical trap layer; a second N-type semiconductor confinement layer; an active region, the active region comprising semiconductor materials; a P-type semiconductor confinement layer, wherein the P-type semiconductor confinement layer, the active region and the second N-type semiconductor confinement layer collectively comprise a heterostructure having a pn-junction (depletion region) substantially close to and within the active region; a P-type contact layer; at least one dielectric layer, each of the at least one dielectric layers having a via etched through it providing electrical contact access to the P-type contact layer that is below the dielectric layer; a second metal contact layer contacting the P-type contact layer.

In some embodiments, he plurality of layers are cleaved in two places along a crystallographic plane, that is perpendicular to plane of the layers, forming a resonating cavity having mirror facets on both ends.

In some embodiments, the semiconductor heterostructure is adapted to support internally a laterally confined asymmetrical optical mode, the asymmetrical optical mode having a peak optical intensity substantially in the intrinsic semiconductor layer, the asymmetrical optical mode having an optical intensity distribution through the plurality of layers that has substantially more optical mode energy distributed within the first and second N-type semiconductor confinement layers, the first and second N-type semiconductor optical trap layers and the N-type semiconductor substrate layer as compared to an amount of optical mode energy present in the P-type semiconductor confinement layer.

According to a fourth broad aspect of the invention provided is a semiconductor optical device having a plurality of layers, the plurality of layers in sequence include a first metal contact layer; a P-type semiconductor substrate; a P-type semiconductor confinement layer; an active region, the active region comprising semiconductor materials; a first N-type semiconductor confinement layer; a first N-type semiconductor optical trap layer; a second N-type semiconductor confinement layer; a second N-type semiconductor optical trap layer; a third N-type semiconductor confinement layer; a N-type contact layer; at least one dielectric layer, each of the at least one dielectric layers having a via etched through it providing electrical contact access to the N-type contact layer that is below the dielectric layer; a second metal contact layer contacting the N-type contact layer.

In some embodiments, the plurality of layers are cleaved in two places along a crystallographic plane, that is perpendicular to plane of the layers and the direction of light propagation, forming a resonating cavity having mirror facets on both ends.

In some embodiments, the semiconductor optical device produces internally a laterally confined asymmetrical optical mode, the asymmetrical optical mode having a peak optical intensity substantially in the intrinsic semiconductor layer, the asymmetrical optical mode having an optical intensity distribution through the plurality of layers that has substantially more optical mode energy distributed within the first and second and third N-type semiconductor confinement layers, the first and second N-type semiconductor optical trap layers as compared to an amount of optical mode energy present in the P-type semiconductor confinement layer.

In some embodiments of the semiconductor heterostructure the two mirror facets are coated with a respective first and second dielectric material. In some embodiments the first dielectric material has a high reflectivity and the second dielectric material has a low reflectivity. Alternatively, both the first and second dielectric materials have low reflectivity.

Other aspects and features of the present invention will become apparent to those of ordinary skill in the art upon review of the following description of specific embodiments of the invention in conjunction with the accompanying figures.

BRIEF DESCRIPTION OF THE DRAWINGS

The invention will now be described in greater detail with reference to the accompanying diagrams, in which.

DETAILED DESCRIPTION OF THE PREFERRED EMBODIMENTS

Figure 1A:
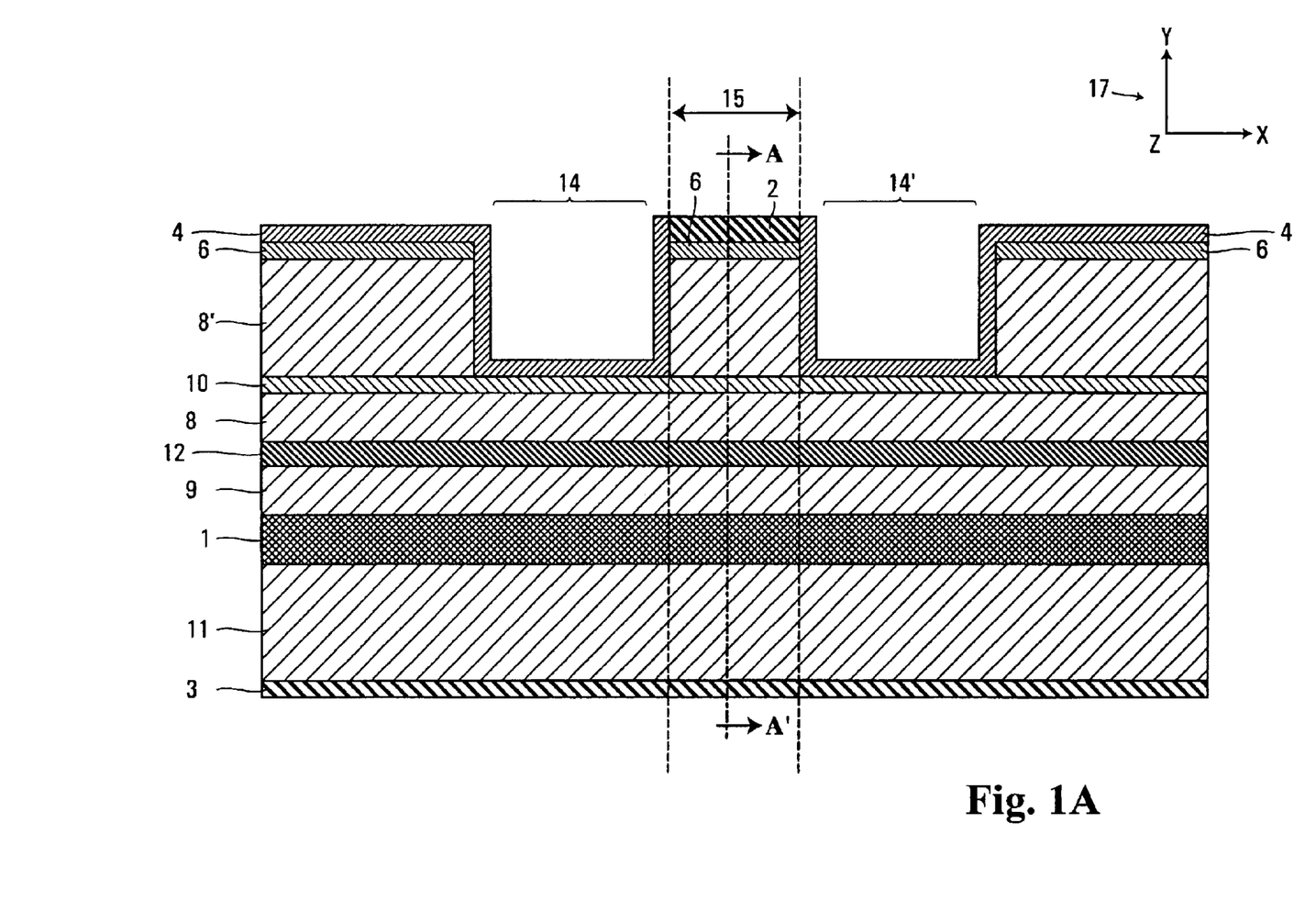
FIG. 1A is a cross-sectional view of a semiconductor laser according to one embodiment of the invention.

Referring to FIG. 1, shown is a high-power ridge semiconductor laser according to one embodiment of the invention. For brevity hereinafter the high-power ridge semiconductor laser will be simply referred to as the laser. The laser consists of the following layers illustrated in FIG. 1 and listed in sequence: a first metal contact layer 3; an N-type substrate layer 11 (for example, InP: Indium Phosphide); an N-type optical trap layer 1 (for example, InGaAsP: Indium Gallium Arsenide and Phosphide alloy), otherwise referred to as a bulk waveguide layer; an N-type confinement layer 9 (for example, N-doped InP); an active region 12, that is typically made up of an i-type (but not necessarily) semiconductor alloy; a first P-type confinement layer 8 (for example, P-doped InP); an etch-stop layer 10 (for example, InGaAsP); a second P-type (InP) confinement layer 8' and a P-type contact layer 6 (for example, InGaAsP). The P-type confinement layer 8' and the P-type contact layer 6 are etched to create trenches 14 and 14' that define a ridge structure 15; at least one dielectric layer 4 (there can be more than one dielectric layer) is then deposited over the exposed surfaces of the laser such that the dielectric material making up the at least one dielectric layer substantially evenly covers the exposed surface including the vertical edges of the trenches 14 and 14', the dielectric material typically being an oxide or nitride compound; and, atop the ridge structure 15 a via (opening) is etched through the at least one dielectric layer 4, exposing the P-type contact layer 6, into which a second metal contact 2 is deposited such that it is in contact with P-type contact layer 6 on the ridge structure 15.

In some embodiments, the layers composing the active region usually include quantum well layers (layers that are quite thin, about 10 atomic layers) and barrier layers (between quantum layers). Both (quantum wells and barriers) are sandwiched on both sides by the P-type and N-type confinement layers 8 and 9 of the semiconductor laser. The confinement layers aid in funnelling electrons and holes into the quantum wells where recombination occurs, and the significant effect of recombination is that light is generated (or equivalently radiation is emitted). This results in the index of refraction profile of the active region 12 having a high index of refraction in the quantum well layers and a lower index of refraction in the barrier layers.

Referring to the first and second P-type confinement layers 8 and 8' and the etch-stop layer 10 shown in FIG. 1: the etch stop layer 10 is used in the manufacturing process of the laser to aid in the creation of trenches 14 and 14'. The etch stop layer 10 does not have a significant effect on the operation of the laser and as such the first and second P-type confinement layers 8 and 8' effectively serve as one P-type confinement layer, with the etch stop layer 10 embedded within the one P-type confinement layer.

The actual Thickness of each of the aforementioned layers that make up the laser is found through empirical study for a particular application. However, the typical thickness or range can be provided here for the most important layers. It should be noted that the cross-sectional view shown in FIG. 1 is not to scale. The N-type substrate layer 11 is not important to the creation of and guiding of the optical mode, but it is required to provide a low electrical resistance mechanical support to the rest of the laser structure and as such it is typically 130 microns thick. The optical trap layer 1 is typically 0.05 to 0.25 microns thick. The N-type confinement layer 9 is slightly thicker, with a typical thickness ranging from 0.1 to 0.7 microns. The etch-stop layer 10 is also not important for the operation of the laser. The etch-stop layer 10 is present to protect the layer underneath it from the etching process used to create the trenches 14 and 14'.

In this embodiment the thickness of the active region 12 typically does not need to exceed 0.1 microns, however can be increased to approximately 1.0 microns for exotic applications. The ridge structure 15 in which the P-type confinement layer 8' is situated is typically 1.5 to 2.5 microns thick. The first metal contact layer 3 and the second metal contact layer 2 are designed to provide a low electrical resistance interface between connecting metals (such as gold or aluminium) to the laser. The thickness of each contact does not greatly impact the optical performance of the laser.

The primary advantage of the ridge structure is that it laterally confines the light in a single narrow optical mode that can be coupled into a telecommunication type optical fiber. There are other structures that can be used to achieve lateral confinement, for example a buried heterostructure, but the ridge is the simplest one to fabricate. The ridge width preferably is about 2–7 microns, but the laser width itself could be 250–500 microns, mostly for handling purposes. The typical cavity length (in the Oz direction) is in the range of 1–4 mm. Preferably the maximum ridge width is about 7 microns. Beyond that, it is almost impossible to maintain a single stable optical mode. Furthermore, on top of the ridge, to ensure a good electrical contact to the laser a highly P-doped layer is used.

The following description of the preferred embodiment assumes the example material introduced above are used. However, other semiconductor materials that are suitable for lasers used in telecommunications applications may be used, for example Gallium Arsenide (GaAs).

With reference to an orthogonal co-ordinate system Oxyz indicated generally at 17, shown in FIG. 1 with the z-axis coming out of the page, the layer interfaces are parallel to each other and also parallel with the plane xOz perpendicular to the line A–A' defined in the Oy direction. The P-type confinement layer 8, the active region 12 and the N-type confinement layer 9, substantially define a heterostructure.

Figure 1B:
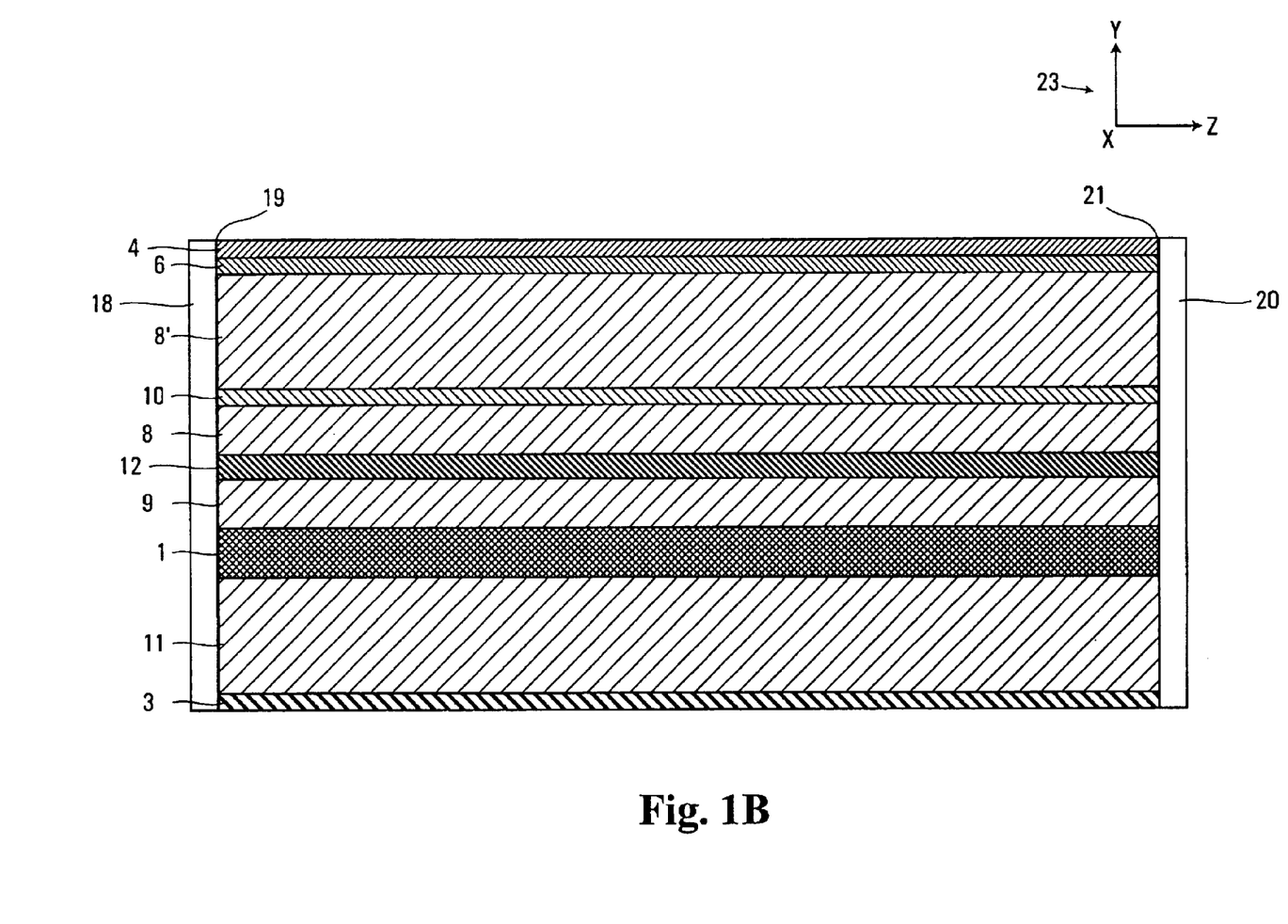
FIG. 1B is a side view of the semiconductor laser illustrated in FIG. 1A.

Referring to FIG. 1B, a side view of the semiconductor laser of FIG. 1A is shown. Laser action is achieved by cleaving the semiconductor heterostructure in two places along a crystallographic plane to form a resonating cavity with mirror facets 19 and 21. In the example given, the crystallographic plane is parallel with the plane yOx. The facets are cleaved perpendicular to the direction of light propagation and the layers that make up the semiconductor heterostructure (i.e. along the plane yOx). In some embodiments, the facets can be coated with dielectric materials 18, 20 to change the reflectivity. For laser applications, preferably a first dielectric material with that is highly reflective is used to coat one facet while the other facet is coated with a second dielectric material that is much less reflective than the first dielectric material.

Figure 2:
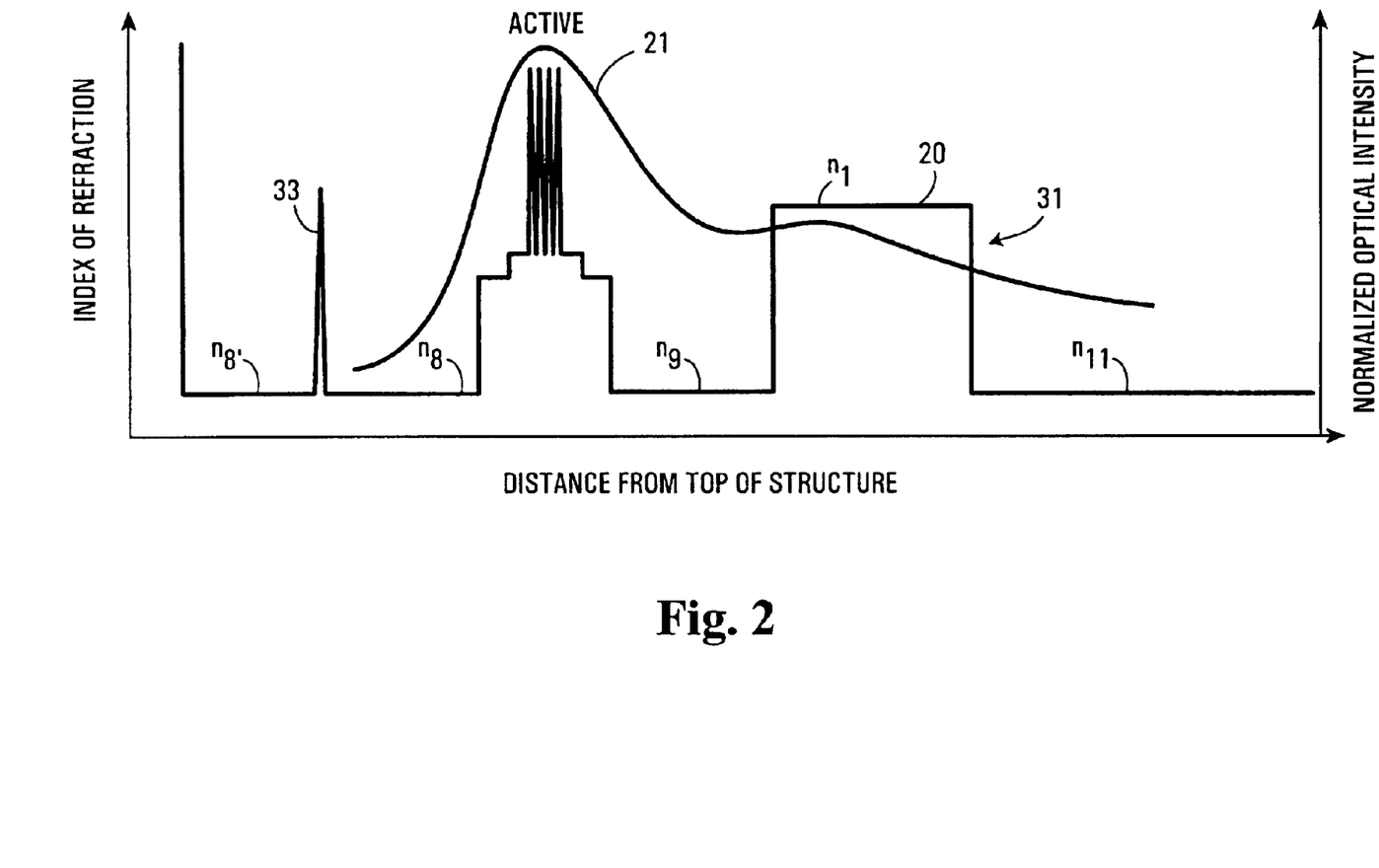
FIG. 2 illustrates the index of refraction profile and the normalized optical intensity profile of an optical mode emitted by the laser of FIG. 1.

FIG. 2 illustrates a refractive index profile 20 for the laser of FIG. 1 as it changes in the Oy direction. Also shown in FIG. 2 is a normalized optical intensity profile 21 for the laser of FIG. 1 as it changes in the Oy direction. Referring now to both FIG. 1 and FIG. 2, layers 8', 8, 9, 1 and 11, shown in FIG. 1, have corresponding refractive indices $n_{8'}$, $n_8$, $n_9$, $n_1$ nd $n_{11}$. The refractive index profile 20 has three peaks. The first refractive index peak 30 occurs in the active region 12 where the composite refractive index profile is generally higher than the refractive indices $n_8$ and $n_9$ corresponding to the P-type confinement layer 8 and N-type confinement layer 9 on either side of the active region respectively. The second refractive index peak 31 occurs in the optical trap layer 1 in which the refractive index is $n_1$. The high refractive indices in the active layer and the optical trap layer each relative to each of the refractive indices $n_8$, $n_9$ and $n_{11}$ are consequences of the active region and optical trap layer both having low band gap energy relative to each of the P-type confinement layer 8, N-type confinement layer 9 and N-type substrate layer 11 respectively. Additionally, the active region 12 generally has a higher refractive index compared to the optical trap layer 1 as a result of having a lower band gap energy as compared to the optical trap layer 1. The third refractive index peak 33 corresponds to the etch-stop layer 10; however the third refractive index peak 33 is very narrow and does not have a significant impact on the overall performance of the laser.

In the laser shown in FIG. 1A the active region 12 is assumed to be composed of quantum wells and barrier layers hence the index of refraction alternates between a higher value for the quantum well layers and a smaller value for the barrier layers. It is also well known to include in the active layer 12 sub-layers on either side of the outermost barrier layers. The sub-layers provide a gradual (stepped) increase in the index of refraction profile up to the value of the index of refraction of the barrier layers. The active region 12 has a refractive index profile that is in the range of 3.35 to 3.45, while the optical trap layer 1 has a retractive index $n_1$ of 3.31. The P-type confinement layer 8, the N-type confinement layer 9 and the N-type substrate 11 all have 3.16 as their refraction indices $n_8$, $n_9$, and $n_{11}$ respectively.

The refractive index 3.16 is that of InP ($n_8$, $n_9$, and $n_{11}$) and as such is fixed for a given wavelength. The other refractive indices vary with the InGaAsP composition that is used. Typically the index in the optical trap layer 1 would vary from 3.25 to 3.35. The refractive index of the active region 12 is approximately an average of the refractive indices of all layers that comprise it and generally would vary from 3.35 to 3.45. As can be seen in FIG. 2 the active region 12 has a stepped refractive index profile leading to series of alternating refractive index peaks and valleys. The peaks correspond to quantum wells whereas the valleys correspond to the barrier layers between the quantum wells.

Referring back to FIG. 1, The laser radiation (light energy) is converted from the electrical energy carried by the injected carriers into the pn-junction (depletion region) that is within the heterojunction in the neighbourhood of the active region 12, specifically in the Ox direction under the ridge structure 15. The laser radiation (light energy) of an optical mode travels in the Oz direction and positive current travels from the second metal contact 2 to the first metal contact 3 substantially parallel the line A–A' when the heterojunction is forward biased.

As the optical mode is primarily generated in the active region 12, the active region 12 generally having the highest refractive index profile within the laser, the optical mode is substantially confined to the active region 12. The energy of the optical mode is confined in the horizontal direction to substantially a single spot by the ridge structure 15. A substantial amount of the energy of the optical mode traversing the N-type confinement layer 9 is gathered and is trapped in the optical trap layer 1. Normally without the optical trap layer, the optical mode would be evenly distributed throughout either side of the active region. Thus, the optical trap layer is breaking the symmetry of the optical mode energy distribution throughout the heterostructure. The optical energy profile of the optical mode is shown in FIG. 2 as the normalized optical intensity profile 21. The peak of the normalized optical intensity profile 21 is substantially within the active region 12 with a secondary peak substantially within the optical trap layer 1. The optical intensity profile 21 is asymmetric as it drops off steeply in the P-type confinement layer 8, thus having a minimal amount of optical mode energy traversing the P-type side of the heterojunction. On the other side (the N-type side) of the same heterojunction the normalized optical intensity profile 21 generally decreases gradually with a shallow slope through the N-type confinement layer 9, the optical trap layer 1 and semiconductor substrate layer 11. There is a secondary peak in the normalized optical intensity profile 21 substantially in the region of the optical trap layer 1 and it is this secondary peak that causes the generally gradual decrease of the normalized optical intensity profile 21 on the N-type side of the heterostructure. Ideally, the secondary peak would not be visible, instead the normalized optical intensity profile 21 on the N-type side of the heterojunction would be a smooth curve with a shallow slope.

Figure 3:
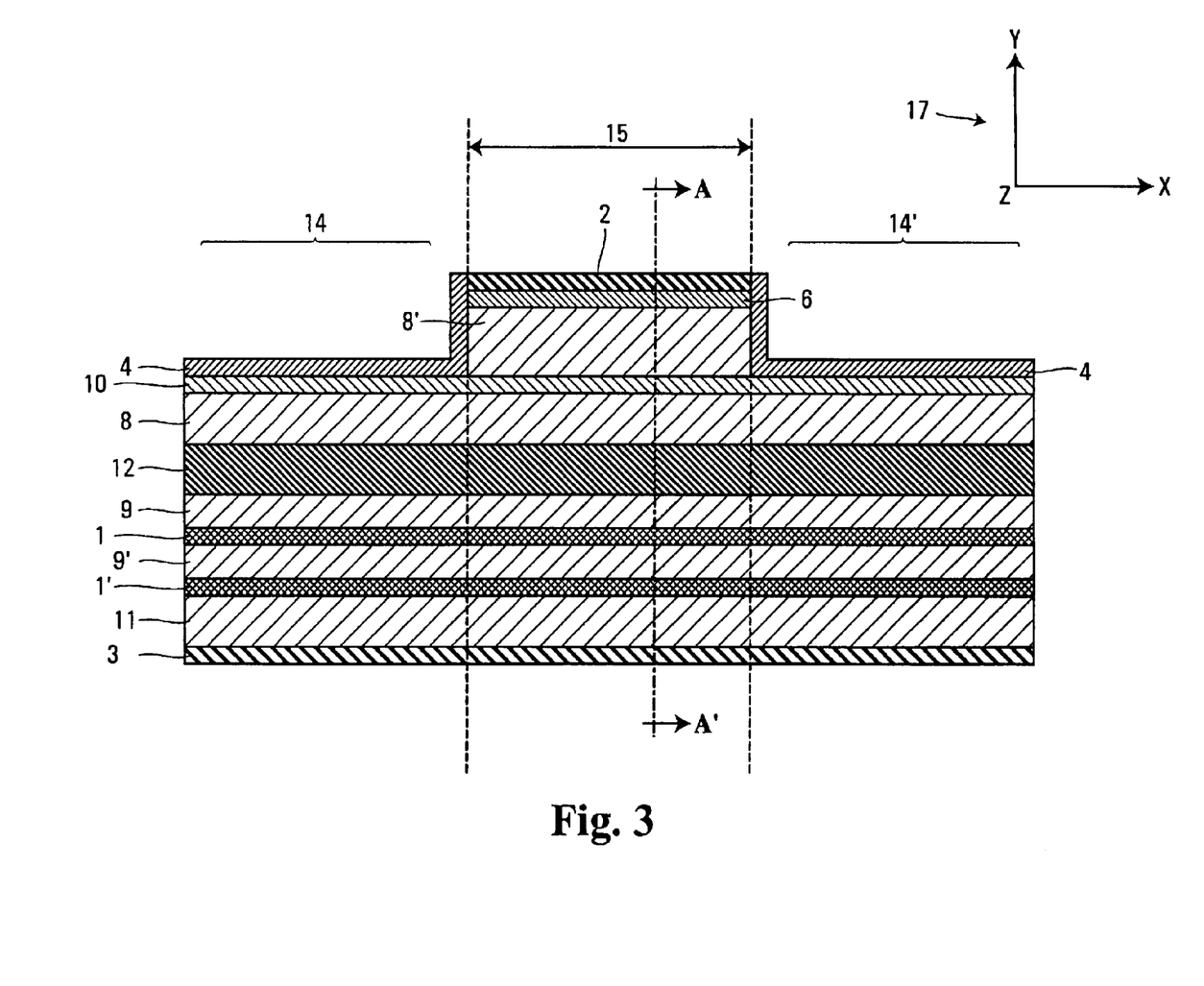
FIG. 3 is a cross-sectional view of a semiconductor laser according to one embodiment of the invention.

Referring to FIG. 3, shown is a high-power ridge semiconductor laser according to a second embodiment of the invention. For brevity hereinafter the high-power ridge semiconductor laser will be simply referred to as the laser. The laser consists of the following layers (where the reference numbers of FIG. 1 are used to identify like elements), as illustrated in FIG. 3: a first metal contact layer 3; an N-type substrate layer 11; two N-type optical trap layers 1 and 1', otherwise referred to as the bulk waveguide layers; between the optical trap layers 1 and 1' there is an N-type confinement layer 9' and above the optical trap layer 1 there is another N-type confinement layer 9; an active region (layer) 12, the active region being typically made up of i-type semiconductor material (but not necessarily); a first P-type confinement layer 8; an etch-stop layer 10; a second P-type confinement layer 8' and a P-type InGaAs contact layer 6. The P-type confinement layer 8' and the P-type contact layer 6 are etched to create trenches 14 and 14' that define a ridge structure 15; at least one dielectric layer 4 is then deposited over the exposed surfaces of the laser such that the dielectric material making up the at least one dielectric layer substantially evenly covers the exposed surface including the vertical edges of the trenches 14 and 14', the dielectric material typically being an oxide or nitrate compound; and, atop the ridge structure 15 a via (opening) is etched through the at least one dielectric layer 4, exposing the P-type contact layer 6, into which a second metal contact 2 is deposited such that it is in contact with P-type contact layer 6 on the ridge structure 15; the at least one dielectric layer 4 typically being a oxide or nitrate compound; and a second metal contact 2.

The actual thickness of each of the aforementioned layers that make up the laser is found through empirical study for a particular application, as before for the first embodiment described in detail above. The optical trap layers 1 and 1' are typically 0.05 to 0.25 microns thick. Each of the N-type confinement layers 9 and 9' has a preferred thickness ranging from 0.1 to 0.7 micron . The etch-stop layer 10 is also not important for the operation of the laser. The etch-stop layer 10 is present to protect the layer underneath it from the etching process used to create the trenches 14 and 14'.

Using a semiconductor heterostructure described above for a laser, laser action is achieved by cleaving the semiconductor heterostructure in two places along a crystallographic plane forming a resonating cavity with mirror facets, as previously described for the first embodiment.

Figure 4:
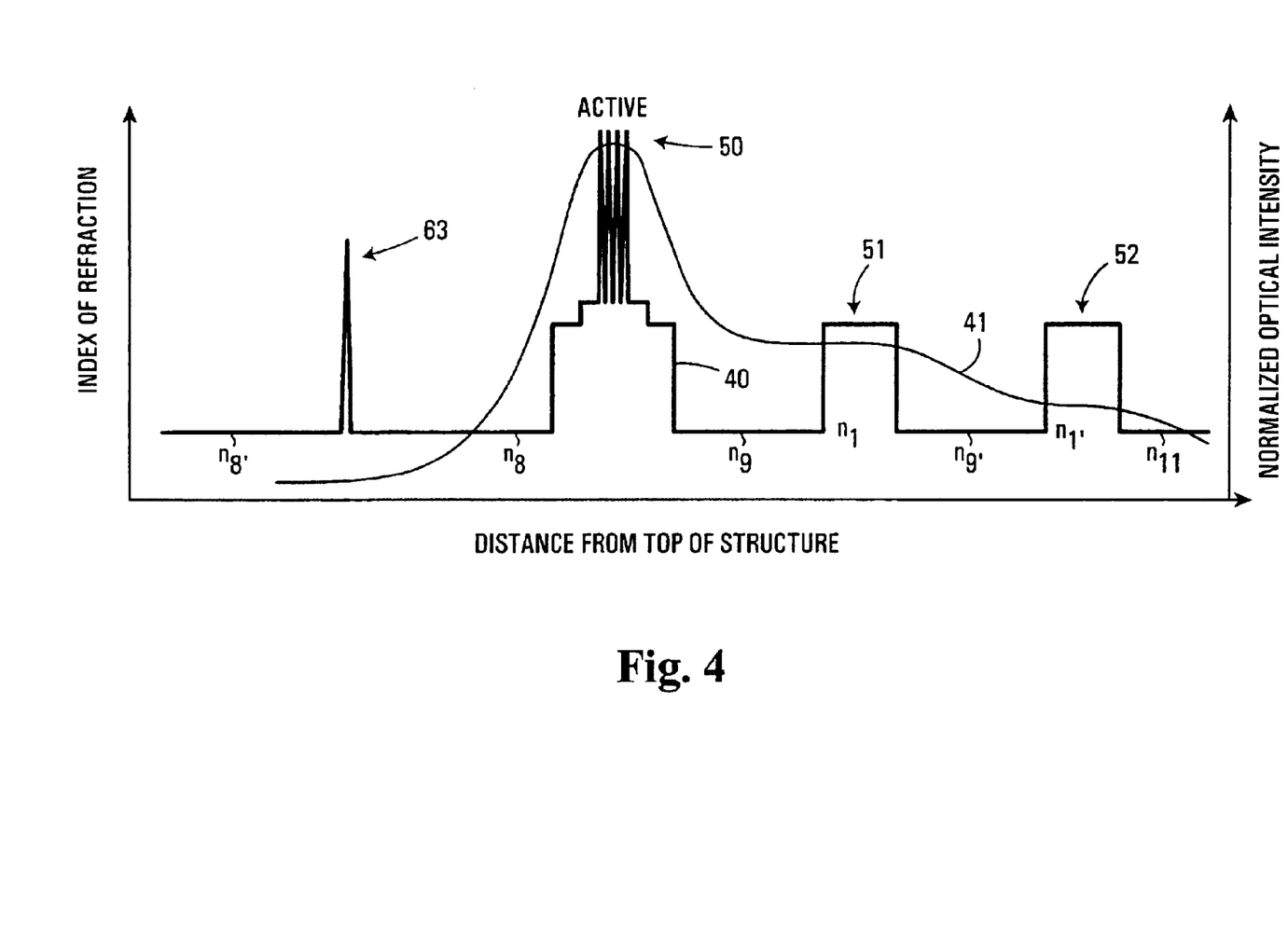
FIG. 4 illustrates the index of refraction profile and the normalized optical intensity profile of an optical mode emitted by the laser of FIG. 3.

FIG. 4 illustrates the refractive index profile 40 as it changes in the Oy direction. Also shown in FIG. 4 is the normalized optical intensity profile 41 as it changes in the Oy direction. Referring jointly to FIG. 3 and FIG. 4, layers 8', 8, 9, 9', 1, 1' and 11, shown in FIG. 3, have corresponding refraction indices $n_{8'}$, $n_8$, $n_9$, $n_{9'}$, $n_1$, $n_{1'}$ and $n_{11}$, shown in FIG. 4. The refractive index profile 40 has four refractive index peaks. Just as in the first embodiment, the first and largest refractive index peak 50 occurs in the active region 12. The refractive index profile of the active region 12 is larger than the refractive indices $n_9$, $n_{9'}$ and $n_8$ corresponding to the two N-type confinement layers 9 and 9' and the P-type confinement layer 8 respectively. The second refractive index peak 51 occurs in the first optical trap layer 1 in which the refractive index is $n_1$, with a third refractive index peak 52 present in the second optical trap layer 1'. In this second embodiment the second and third refractive index peaks 51 and 52 are substantially equal, however this is not a constraint of the invention. The high refractive index profile of the active region and the high refractive indices $n_1$, and $n_{1'}$ each relative to each of the refractive indices $n_8$, $n_9$, $n_{9'}$ and $n_{11}$ are consequences of the active region 12 and optical trap layers 1 and 1' each having low band gap energy relative to each of the P-type confinement layer 8, N-type confinement layer 9 and N-type substrate layer 11 respectively. Additionally, the active region 12 has a higher refractive index compared to either of the optical trap layers 1 and 1' as a result of having a lower band gap energy as compared to either of the optical trap layers 1 and 1'. The fourth refractive index peak 63 corresponds to the etch-stop layer 10; however the fourth refractive index peak 63 does not have a significant impact on the overall performance of the laser.

Referring back to FIG. 3, the laser radiation (light energy) is converted from the electrical energy carried by the injected carriers into the pn-junction that is within the heterojunction in the neighbourhood of the active region 12, specifically in the Ox direction under the ridge structure 15. The laser radiation (light energy) travels in the Oz direction and positive current travels from the second metal contact 2 to the first metal contact 1 substantially along the line A–A' when the heterojunction defined by layers 8, 12 and 9 is forward biased.

As an optical mode is initially generated in the active region 12, the active region 12 having the highest refractive index $n_{12}$ within the laser, the optical mode is substantially confinement to the active region 12. The energy of optical mode is also guided away from the P-type confinement layer 8 by the ridge structure 15 such that substantially more of the optical mode energy is guided towards and into the N-type confinement layer 9 adjacent to the opposite side of the active region 12. However, a substantial amount of the energy of the optical mode traversing the N-type confinement layer 9 pulled further away from the active region 12 by the optical trap layers 1 and 1'. Each optical trap layer 1 and 1' gathers and traps optical energy within it as a result of having higher refractive indices $n_1$ and $n_{1'}$ relative to each of the refractive indices $n_9$, $n_{9'}$ and $n_{11}$ corresponding to the N-type confinement layers 9 and 9' and N-type substrate layer 11 respectively. The optical energy profile of the optical mode is shown in FIG. 4 as the normalized optical intensity profile 41. The peak of the normalized optical intensity profile 41 is substantially within the active region 12 with secondary and tertiary peaks substantially within the optical trap layers 1 and 1'. The secondary and tertiary peaks serve to flatten out the normalized optical intensity profile 41 on the side N-type side of the heterojunction defined by layers 8, 12 and 9. The optical intensity profile 41 is asymmetric as it drops of steeply in the P-type confinement layer 8, thus having a minimal amount of optical mode energy traversing the P-type side of the heterojunction defined by layer 8, 12 and 9, and decreases gradually with a shallow slope through the N-type confinement layer 9, the optical trap layer 1 and semiconductor substrate layer 11.

Common to both embodiments of the lasers, shown in FIGS. 1 and 3, is the fact that the optical mode generated by both lasers have asymmetric normalized optical intensity profiles in which the amount of energy traversing a P-type layer of a heterojunction within each laser is minimized in order to minimize the optical losses in the lossy P-type material. The peak of each normalized optical intensity profile remains within each respective active region, that comprise a portion of each respective heterojunction, allowing each respective optical mode to gain energy. At the same time the optical trap layers embedded within the N-type confinement layer cause the normalized optical intensity profile to flatten out on the N-type side of each respective heterojunction. This asymmetric normalized optical intensity profile is then not so narrow as to suffer from a wide far field and can be coupled into a fiber with minimal losses. In other words, because the normalized optical intensity profile is asymmetric, having a steep drop-off on the P-type side of the heterojunction and a gradual drop-off on the N-type side of the heterojunction, the tar field of the optical mode will be narrow and thus suffer from less coupling loss as compared to a laser with a wide far field that is a result of having a symmetric and narrow normalized optical intensity profile. Thus the external efficiency measured at the end of a pigtail will increase substantially as compared to high-power lasers having a wide far field that have their beams coupled to a fiber for industrial packaging purposes as already described.

Furthermore, embodiments with more than two optical trap layers are within the scope of this invention. The laser is preferably embodied using a ridge structure on the P-type side of a heterojunction. In some embodiments the laser is provided without a ridge structure. Alternatively, the ridge structure could be on the N-type side of the heterojunction.

Figure 5:
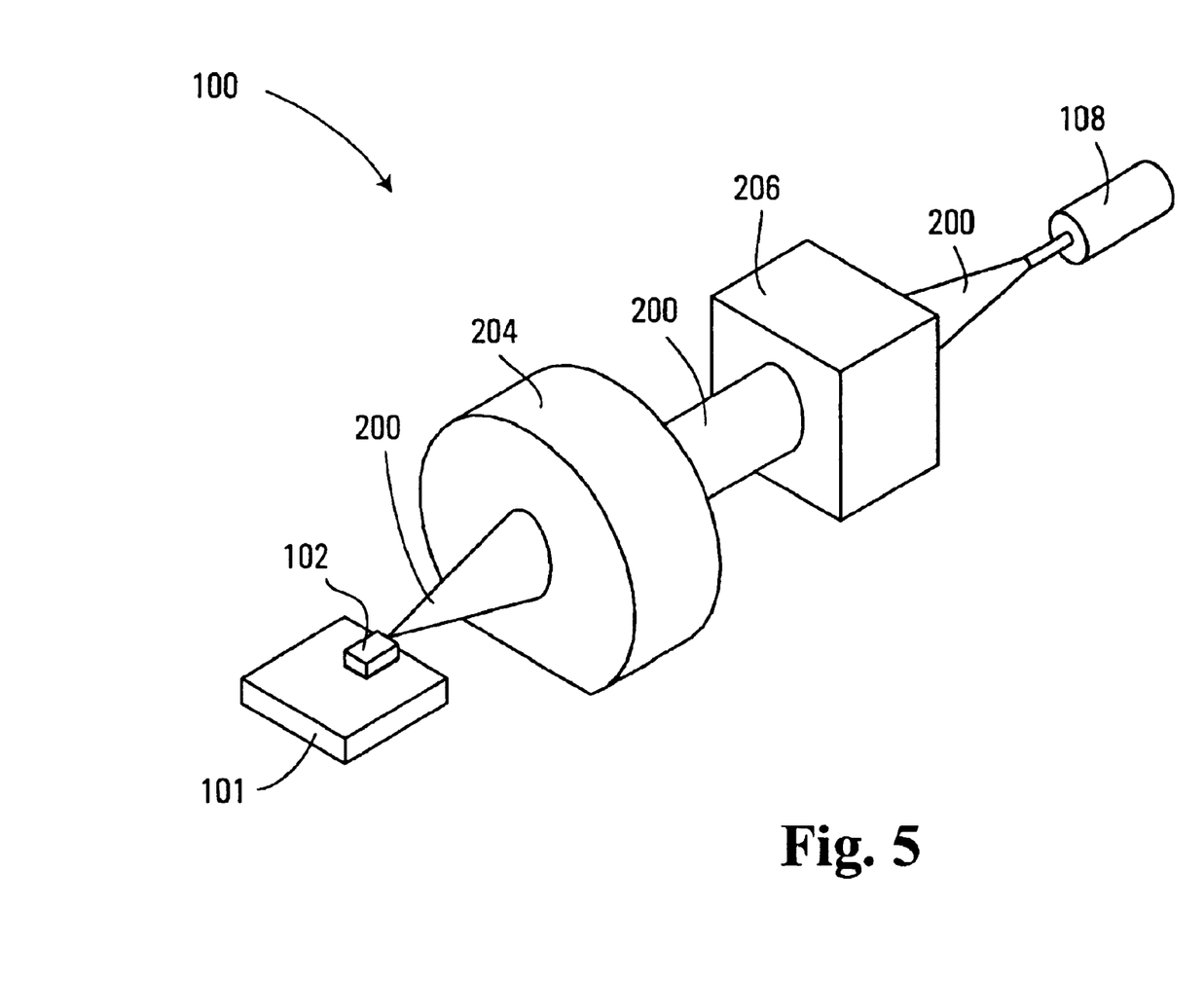
FIG. 5 is a simplified diagram illustrating how the output or the laser (of either FIG. 1 or FIG. 3), a light beam, is coupled to an optical fiber.

Referring to FIG. 5, shown is a light-beam coupling configuration indicated generally at 100. A laser mount 101 mechanically supports a laser 102. The laser mount 101 also serves as a heat sink and a platform from which the laser 102 can draw electrical current. The output of the laser 102 is a light beam 200 that is substantially comprised of the optical mode previously discussed in relation to the lasers of FIG. 1 and FIG. 3. The light beam 200 is focused by a first lens 204 and then focused again by a second lens 206. The lens 206 focuses the light beam 200 into an optical fiber 108. The optical fiber 108 is a short length of optical fiber, a pigtail, or a longer piece of optical fiber. The light-beam coupling configuration 100 is typically packaged as a discrete component; however, it may also be integrated into an optical transceiver.

As previously described, the energy losses are a result of the fact that the laser emits a divergent elliptical beam, which poorly couples into a circular optical fiber that accepts only light from a particular cone. As a result of aspects of the invention disclosed it is possible to shape a far field that would have a full-width at half-maximum (FWHM) of 25 degrees in the Oy direction and a FWHM of 10 degrees in the Ox direction. The optical fiber requires that the light be within a cone of 15 degrees circular.

What has been described is merely illustrative of the application of the principles of the invention. Other arrangements and methods can be implemented by those skilled in the art without departing from the spirit and scope of the present invention.

Specifically, other semiconductor optical devices, such as amplifiers and distributed feedback lasers or other devices containing gratings, can be constructed using the same semiconductor heterostructure as the embodiments of the semiconductor laser provided. The same structure maybe used to produce an amplifier by applying a low reflectivity coating to the facets. Another embodiment of the invention provides the semiconductor heterostructure per se.

I claim:

1. A semiconductor laser comprising a plurality of layers, the plurality of layers in sequence comprising:
   i) a first metal contact layer;
   ii) an N-type semiconductor substrate;
   iii) an N-type semiconductor optical trap layer;
   iv) an N-type semiconductor confinement layer;
   v) an active region, the active region comprising semiconductor materials;
   vi) a P-type semiconductor confinement layer, wherein the P-type semiconductor confinement layer, the active region and N-type semiconductor confinement layer collectively comprise a heterostructure having a pn-junction (depletion region) substantially close to and within the active region;
   vii) a P-type contact layer;
   viii) at least one dielectric layer, each of the at least one dielectric layer having a via etched through it providing electrical contact access to the P-type contact layer;
   ix) a second metal contact layer contacting the P-type contact layer,
   wherein the N-type semiconductor optical trap layer has a higher refractive index than the N-type semiconductor substrate and the N-type semiconductor confinement layer.

2. A semiconductor laser according to claim 1 wherein the plurality of layers are cleaved in at least two places along a crystallographic plane, that is perpendicular to plane of the layers, forming a resonating cavity having mirror facets on both ends.

3. The semiconductor laser of claim 2, wherein the two mirror facets are coated with respective first and second dielectric materials.

4. The semiconductor laser of claim 3, wherein the first dielectric material is highly reflective.

5. The semiconductor laser of claim 4, wherein the second dielectric material is less reflective than the first dielectric material.

6. A semiconductor laser according to claim 1 wherein the semiconductor laser produces internally a laterally confined asymmetrical optical mode having a peak optical intensity substantially in the active region, the asymmetrical optical mode having an optical intensity distribution through the plurality of layers that has substantially more optical mode energy distributed within the N-type semiconductor confinement layer, the N-type semiconductor optical trap layer and the N-type semiconductor substrate layer as compared to an amount of optical mode energy present in the P-type semiconductor confinement layer.

7. The semiconductor laser of claim 6, further comprising a ridge structure, wherein the P-type semiconductor confinement layer is partially within the ridge structure, the ridge structure laterally confining the laterally confined asymmetrical optical mode.

8. The semiconductor laser of claim 1, wherein the active region comprises a plurality of quantum wells, each quantum well sandwiched between two barrier layers.

9. The semiconductor laser of claim 1 further comprising an etch-stop layer embedded within the P-type semiconductor confinement layer.

10. The semiconductor laser of claim 1, further comprising a ridge structure, wherein the P-type semiconductor confinement layer is substantially within the ridge structure.

11. The semiconductor laser of claim 1, further comprises a ridge structure containing a substantial portion of the P-type semiconductor confinement layer.

12. The semiconductor laser of claim 1, wherein the semiconductor laser of claim 1, wherein the N-type semiconductor substrate layer is N-type InP.

13. The semiconductor laser of claim 1, wherein the N-type semiconductor optical trap layer is an N-type InGaAsP alloy.

14. The semiconductor laser of claim 1, wherein the N-type semiconductor confinement layer is N-type InP.

15. The semiconductor laser of claim 1, wherein the active region is substantially made up of an InGaAsP alloy.

16. The semiconductor laser of claim 1, wherein P-type semiconductor confinement layer is P-type InP.

17. The semiconductor laser of claim 1 further comprising below the N-type semiconductor optical trap layer at least one additional N-type semiconductor confinement layer and at least one additional N-type semiconductor optical trap layer.

18. The semiconductor laser of claim 17, further comprising an etch-stop layer embedded within the P-type semiconductor confinement layer.

19. The semiconductor laser of claim 18, further comprising a ridge structure, wherein the P-type semiconductor confinement layer is substantially within the ridge structure.

20. The semiconductor laser of claim 1, wherein the N-type semiconductor optical trap layer comprises a plurality of sub-layers.

21. A semiconductor laser comprising a plurality of layers, the plurality of layers in sequence including:
(i) an active region, the active region comprising semiconductor materials;
(ii) a first N-type semiconductor confinement layer;
(iii) an N-type semiconductor optical trap layer;
(iv) a second N-type semiconductor confinement layer;
the laser internally generating an asymmetrical optical mode, the asymmetrical optical mode having a single maximum optical intensity peak substantially in the active region and optical intensity distribution that has substantially more of the optical mode energy distributed to a first side of the active region in the optical trap layer and the first and second confinement layers as compared to the amount of the optical mode energy on an opposite second side of the active region.

22. A semiconductor heterostructure comprising a plurality of layers, the plurality of layers in sequence comprising:
i) a first metal contact layer;
ii) an N-type semiconductor substrate;
iii) a first N-type semiconductor optical trap layer;
iv) a first N-type semiconductor confinement layer;
v) a second N-type semiconductor optical trap layer;
vi) a second N-type semiconductor confinement layer;
vii) an active region, the active region comprising semiconductor materials;

viii) a P-type semiconductor confinement layer, wherein the P-type semiconductor confinement layer, the active region and the second N-type semiconductor confinement layer collectively comprise a heterostructure having a pn-junction (depletion region) substantially close to and within the active region;
ix) a P-type contact layer;
x) at least one dielectric layer, each of the at least one dielectric layers having a via etched through it providing electrical contact access to the P-type contact layer that is below the dielectric layer;
xi) a second metal contact layer contacting the P-type contact layer,
wherein the first N-type semiconductor optical trap layer has a higher refractive index than the N-type semiconductor substrate and the first N-type semiconductor confinement layer, and the second N-type semiconductor optical trap layer has a higher refractive index than the first N-type semiconductor confinement layer and the second N-type semiconductor confinement layer.

23. A semiconductor heterostructure according to claim 22 wherein the plurality of layers are cleaved in two places along a crystallographic plane, that is perpendicular to plane of the layers, forming a resonating cavity having mirror facets on both ends.

24. The semiconductor heterostructure of claim 23, wherein the two mirror facets are coated with respective first and second dielectric materials.

25. The semiconductor heterostructure of claim 24, wherein the first and second dielectric materials both have low reflectivity.

26. A semiconductor heterostructure according to claim 22 wherein the semiconductor heterostructure is adapted to support internally a laterally confined asymmetrical optical mode, the asymmetrical optical mode having a peak optical intensity substantially in the intrinsic semiconductor layer, the asymmetrical optical mode having an optical intensity distribution through the plurality of layers that has substantially more optical mode energy distributed within the first and second N-type semiconductor confinement layers, the first and second N-type semiconductor optical trap layers and the N-type semiconductor substrate layer as compared to an amount of optical mode energy present in the P-type semiconductor confinement layer.

27. The semiconductor heterostructure of claim 23, wherein the first dielectric material is highly reflective.

28. The semiconductor heterostructure of claim 27, wherein the second dielectric material is less reflective than the first dielectric material.

29. A semiconductor heterostructure according to claim 22 wherein the semiconductor optical device produces internally a laterally confined asymmetrical optical mode, the asymmetrical optical mode having a peak optical intensity substantially in the intrinsic semiconductor layer, the asymmetrical optical mode having an optical intensity distribution through the plurality of layers that has substantially more optical mode energy distributed within the first and second and third N-type semiconductor confinement layers, the first and second N-type semiconductor optical trap layers as compared to an amount of optical mode energy present in the P-type semiconductor confinement layer.

30. A semiconductor optical device comprising a plurality of layers, the plurality of layers in sequence comprising:
i) a first metal contact layer;
ii) a P-type semiconductor substrate;
iii) a P-type semiconductor confinement layer;

iv) an active region, the active region comprising semiconductor materials;

v) a first N-type semiconductor confinement layer;

vi) a first N-type semiconductor optical trap layer;

vii) a second N-type semiconductor confinement layer;

viii) a second N-type semiconductor optical trap layer;

ix) a third N-type semiconductor confinement layer;

x) a N-type contact layer;

xi) at least one dielectric layer, each of the at least one dielectric layers having a via etched through it providing electrical contact access to the N-type contact layer that is below the dielectric layer;

xii) a second metal contact layer contacting the N-type contact layer, wherein the first N-type semiconductor optical trap layer has a higher refractive index than the first N-type semiconductor confinement layer and the second N-type semiconductor confinement layer and the second N-type semiconductor optical trap layer has a higher refractive index than the second N-type semiconductor confinement layer and the third N-type semiconductor confinement layer.

31. A semiconductor optical device according to claim 30 wherein the plurality of layers are cleaved in two places along a crystallographic plane, that is perpendicular to plane of the layers and the direction of light propagation, forming a resonating cavity having mirror facets on both ends.

32. The semiconductor optical device of claim 31, wherein the two mirror facets are coated with respective first and second dielectric materials.

33. The semiconductor optical device of claim 32, wherein the first and second dielectric materials have a low reflectivity.

34. The semiconductor optical device of claim 32, wherein the first dielectric material is highly reflective.

35. The semiconductor optical device of claim 34, wherein the second dielectric material is less reflective than the first dielectric material.

* * * * *